(12) United States Patent
Choi et al.

(10) Patent No.: US 7,172,946 B2
(45) Date of Patent: Feb. 6, 2007

(54) METHODS FOR FORMING SEMICONDUCTOR DEVICES INCLUDING THERMAL PROCESSING

(75) Inventors: Jae-hyoung Choi, Kwangmyung (KR); Wan-don Kim, Yongin (KR); Cha-young Yoo, Suwon (KR); Suk-jin Chung, Suwon (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 112 days.

(21) Appl. No.: 10/629,430

(22) Filed: Jul. 29, 2003

(65) Prior Publication Data

US 2004/0102015 A1 May 27, 2004

(30) Foreign Application Priority Data

Nov. 26, 2002 (KR) ...................... 10-2002-0073820

(51) Int. Cl.
*H01L 21/20* (2006.01)
(52) U.S. Cl. ................. 438/396; 257/E21.008
(58) Field of Classification Search ........ 438/253–256, 438/396–399, 381, 386, 387, 393
See application file for complete search history.

(56) References Cited

U.S. PATENT DOCUMENTS 6,235,572 B1 * 5/2001 Kunitomo et al. .......... 438/240
6,475,854 B2 * 11/2002 Narwankar et al. ......... 438/238
6,664,157 B2 * 12/2003 Iijima et al. ................ 438/238
6,797,560 B2 * 9/2004 Hosoda et al. .............. 438/240
2003/0107076 A1 * 6/2003 Lin et al. .................... 257/309

FOREIGN PATENT DOCUMENTS

| KR | 10-2001-0020024 | 3/2001 |
| KR | 010020024 A | 3/2001 |
| KR | P2001-0020024 | 3/2001 |

OTHER PUBLICATIONS

Korean Patent Office, Notice to Submit Response, May 31, 2004.

* cited by examiner

*Primary Examiner*—Scott B. Geyer
(74) *Attorney, Agent, or Firm*—Myers Bigel Sibley & Sajovec

(57) ABSTRACT

Methods for fabricating semiconductor memory devices may include forming a first conductive layer for a first electrode on a semiconductor substrate, forming a dielectric layer on the first conductive layer, and forming a second conductive layer for a second electrode on the dielectric layer. Portions of the second conductive layer and the dielectric layer can be removed, and a thermal process can be performed on the second conductive layer and the dielectric layer. The thermal process can reduce interface stress between the second conductive layer and the dielectric layer and/or cure the dielectric layer. In addition, the dielectric layer may be maintained in an amorphous state during and after the thermal process.

27 Claims, 7 Drawing Sheets

METHODS FOR FORMING SEMICONDUCTOR DEVICES INCLUDING THERMAL PROCESSING

RELATED APPLICATIONS

This application claims the benefit of priority from Korean Patent Application No. 2002-73820, filed on Nov. 26, 2002 in the Korean Intellectual Property Office, the disclosure of which is incorporated herein in its entirety by reference.

FIELD OF THE INVENTION

The present invention relates to methods for manufacturing semiconductor devices, and more particularly, to methods for manufacturing capacitors.

BACKGROUND OF THE INVENTION

As the integration of semiconductor devices has increased, the area occupied by individual devices on a semiconductor substrate (chip) has been reduced. Information storage capacitors for DRAM devices, however, may need to maintain a same or increased capacitance within a reduced area. Accordingly, various methods have been developed to provide increased capacitor electrode surface areas. For example, capacitors having lower electrodes with three-dimensional shapes such as cylindrical shapes or fin shapes have been provided. In addition, hemispheric grains have been coated on surfaces of lower electrodes, thickness of dielectric layers have been reduced, and dielectric layers having high dielectric constants and/or formed of ferroelectric materials have been provided.

When the thickness of a dielectric layer is reduced, leakage currents may occur due to tunneling effects. Accordingly, when a material having high electric constant, such as $Ta_2O_5$ or BST ($(Ba,Sr)TiO_3$), is used as a dielectric material, a polysilicon layer may be unsuitable for use as a capacitor electrode. Thus, when a material having a high dielectric constant or a ferroelectric material is used as a dielectric layer, a metal such as platinum (Pt), ruthenium (Ru), iridium (Ir), rhodium (Rh), or osmium (Os), having a high work function, may be used as an electrode material.

A method for manufacturing a conventional Metal-Insulator-Metal (MIM) capacitor will now be discussed with reference to FIGS. 1A and 1B.

Referring to FIG. 1A, a conductive layer 20 for a lower capacitor electrode is deposited on a semiconductor substrate 10. Here, the conductive layer 20 is formed of Pt, Ru, Ir, Rh, or Os. A dielectric layer, such as a tantalum oxide layer 30, is deposited on the conductive layer 20. The tantalum oxide layer 30 is deposited in an amorphous state so that the dielectric characteristics of the tantalum oxide layer 30 may be relatively poor. On the other hand, when the tantalum oxide layer 30 is crystallized, the dielectric constant may increase but leakage current characteristics may deteriorate. Accordingly, after the tantalum oxide layer 30 is deposited, a thermal process for improving the dielectric constant can be performed at a temperature less than that required to crystallize the amorphous tantalum oxide layer 30. Such a curing process can be performed at a temperature of, for example, about 600° C. in a nitrogen atmosphere.

Referring to FIG. 1B, a conductive layer 40 for an upper electrode is deposited on the cured tantalum oxide layer 30. Here, the conductive layer 40 is formed of the same material as the conductive layer 20. Thereafter, to measure the characteristics of a capacitor, the conductive layer 40 and the tantalum oxide layer 30 are dry etched. Thus, a predetermined portion of the conductive layer 20 is exposed. In addition, a thermal process is performed to relieve stress at the interface between the conductive layer 40 and the tantalum oxide layer 30 due to lattice defects. Here, the thermal process for relieving stress is performed at a low temperature of, for example, about 400° C. in an oxygen atmosphere.

However, the thermal processes after depositing the dielectric layer and etching the conductive layer for the upper electrode may complicate the conventional method for manufacturing an MIM capacitor. In other words, since a wafer may need to be transferred for each thermal process, the conventional method may require an increased amount of time, and contaminants may remain on the wafer.

SUMMARY OF THE INVENTION

According to embodiments of the present invention, methods for fabricating a semiconductor memory device may include forming a first conductive layer for a first electrode on a semiconductor substrate, forming a dielectric layer on the first conductive layer, and forming a second conductive layer for a second electrode on the dielectric layer. Portions of the second conductive layer and the dielectric layer can be removed, and a thermal process can be performed on the second conductive layer and the dielectric layer at a temperature of at least about 400° C. More particularly, the thermal process may include heating the second conductive layer and the dielectric layer to a first temperature in the range of about 450° C. to 600° C. in an inert gas atmosphere, and heating the second conductive layer and the dielectric layer to a second temperature in the range of about 350° C. to 450° C. in a gas atmosphere including oxygen. Forming the dielectric layer can also be preceded by depositing a seed layer on the first conductive layer, and crystallizing the seed layer.

Performing the thermal process can include heating the dielectric layer and the second conductive layer at a temperature in the range of about 450° C. to 600° C. in an inert gas atmosphere. In an alternative, performing the thermal process can include heating the dielectric layer and the second conductive layer at a first temperature in the range of about 350° C. to 450° C. in a gas atmosphere including oxygen, and then heating the dielectric layer and the second conductive layer at a second temperature in the range of about 450° C. to 600° C. in an inert gas atmosphere. In another alternative, performing the thermal process can include heating the dielectric layer and the second conductive layer at a first temperature in the range of about 650° C. to 700° C. in an inert gas atmosphere, and then heating the dielectric layer and the second conductive layer at a second temperature in the range of about 350° C. to 450° C. in a gas atmosphere including oxygen.

In yet another alternative, performing the thermal process can include heating the dielectric layer and the second conductive layer at a temperature in the range of about 650° C. to 700° C. in an inert gas atmosphere. In still another alternative, performing the thermal process can include heating the dielectric layer and the second conductive layer at a first temperature in the range of about 350° C. to 450° C. in a gas atmosphere including oxygen, and then heating the dielectric layer and the second conductive layer at a second temperature in the range of about 650° C. to 700° C. in an inert gas atmosphere.

The first conductive layer may include at least one material selected from the group consisting of platinum (Pt), ruthenium (Ru), iridium (Ir), rhodium (Rh), and/or osmium (Os), and the second conductive layer may include a same material as the first conductive layer. Moreover, the dielectric layer may include tantalum oxide, and forming the dielectric layer may include depositing tantalum oxide at a temperature in the range of about 380° C. to 500° C. using chemical vapor deposition (CVD). In addition, removing portions of the second conductive layer and the dielectric layer may include dry etching the second conductive layer and the dielectric layer.

Performing the thermal process may include performing the thermal process on the second conductive layer and the dielectric layer after removing portions of the second conductive layer and the dielectric layer. Moreover, the thermal process may reduce an interface stress between the second conductive layer and the dielectric layer and/or cure the dielectric layer. In addition, the thermal process may be performed on the second conductive layer and the dielectric layer while maintaining the dielectric layer in a substantially amorphous state during and after the thermal process.

According to additional embodiments of the present invention, methods for fabricating a semiconductor memory device may include forming a first conductive layer for a first electrode on a semiconductor substrate, forming a tantalum oxide layer on the first conductive layer, and forming a second conductive layer for a second electrode on the tantalum oxide layer. Portions of the second conductive layer and the tantalum oxide layer can be removed, and a thermal process may be performed to reduce an interface stress between the second conductive layer and the tantalum oxide layer and to cure the tantalum oxide layer. Moreover, the tantalum oxide layer can be maintained in a substantially amorphous state during and after the thermal process.

According to still additional embodiments of the present invention, methods for fabricating a semiconductor memory device may include forming a first conductive layer for a first electrode on a semiconductor substrate, forming a tantalum oxide layer on the first conductive layer, and forming a second conductive layer for a second electrode on the tantalum oxide layer. Portions of the second conductive layer and the tantalum oxide layer can be removed, and a thermal process can be performed to reduce interface stress between the second conductive layer and the tantalum oxide layer and to crystallize the tantalum oxide layer.

According to still additional embodiments of the present invention, methods for fabricating a semiconductor memory device may include forming a first conductive layer for a first electrode on a semiconductor substrate, forming a seed layer on the first conductive layer, and crystallizing the seed layer. A tantalum oxide layer can be formed on the crystallized seed layer, and a second conductive layer for a second electrode can be formed on the tantalum oxide layer. Portions of the second conductive layer and the tantalum oxide layer can be removed, and a thermal process can be performed to reduce an interface stress between the second conductive layer and the tantalum oxide layer and to cure the tantalum oxide layer.

DETAILED DESCRIPTION

Figure 1A:
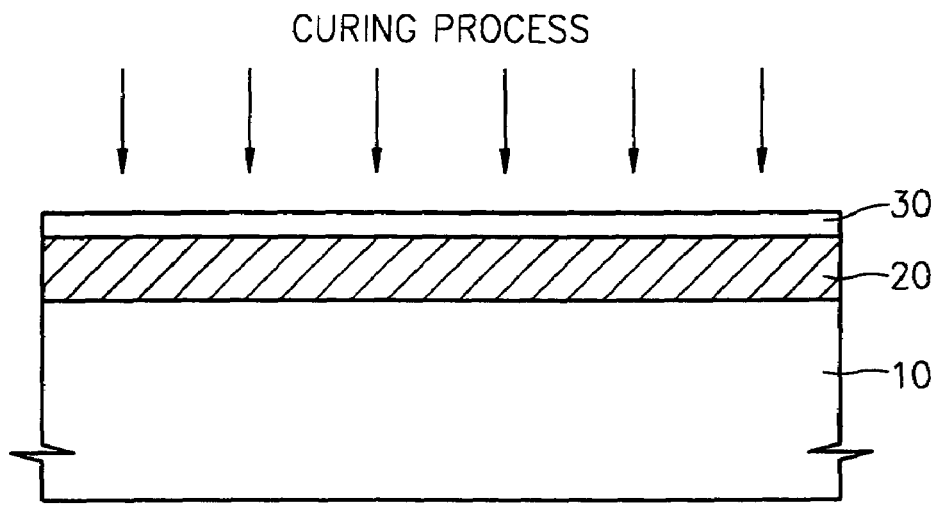
FIGS. 1A and 1B are cross-sectional views illustrating a conventional method for manufacturing a metal-insulator-metal (MIM) capacitor.

The present invention will now be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the size and the thickness of layers and regions are exaggerated for clarity. It will also be understood that when a layer is referred to as being on another layer or substrate, it can be directly on the other layer or substrate, or intervening layers may also be present.

Figure 2A:
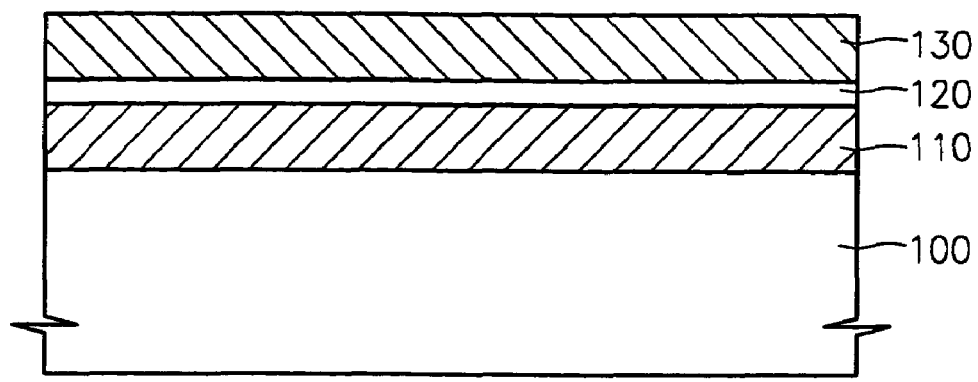
FIGS. 2A through 2C are cross-sectional views illustrating methods for manufacturing semiconductor memory devices according to embodiments of the present invention.
Figure 2B:
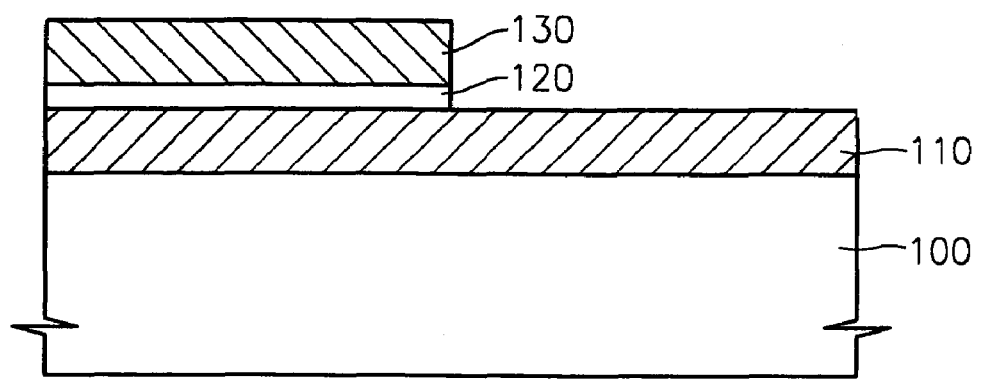
Figure 2C:
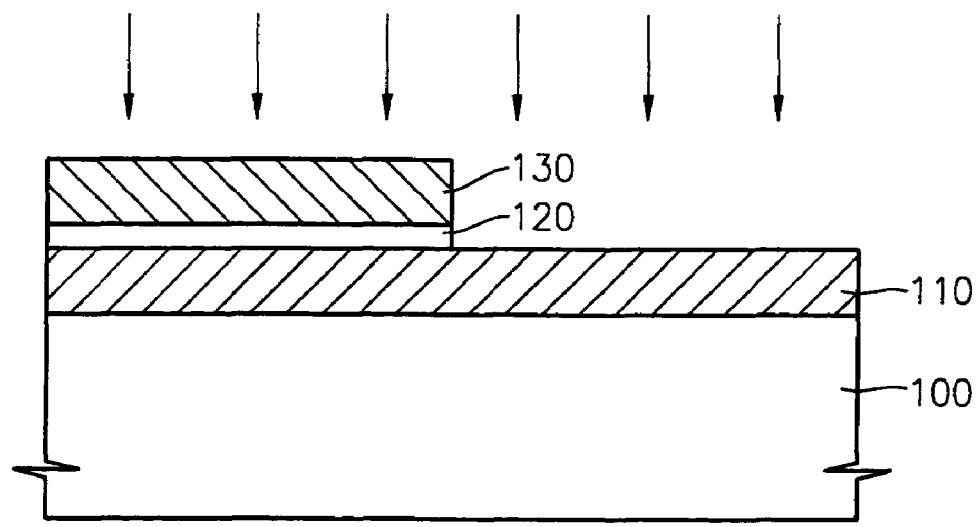

FIGS. 2A through 2C are cross-sectional views illustrating methods for manufacturing metal-insulator-metal (MIM) capacitors according to embodiments of the present invention. Referring to FIG. 2A, a conductive layer 110 for a lower electrode is deposited on a semiconductor substrate 100. Here, the semiconductor substrate 100 may include, for example, MOS transistors, bit lines, and/or insulating layers that insulate each layer. The conductive layer 110 for the lower electrode may be formed of, for example, a metal such as platinum (Pt), ruthenium (Ru), iridium (Ir), rhodium (Rh), and/or Osmium (Os), having a relatively high work function. A tantalum oxide layer ($Ta_2O_5$) 120 can be deposited on the conductive layer 110 for the lower electrode to provide a capacitor dielectric layer. Here, the tantalum oxide layer 120 can be formed using chemical vapor deposition (CVD) at a temperature in the range of about 380° C. to 500° C. Thereafter, a conductive layer 130 for an upper electrode can be deposited on the tantalum oxide layer 120. The conductive layer 130 for an upper electrode can be formed of the same material as the conductive layer 110 for the lower electrode. A curing of the tantalum oxide layer 120 can be omitted prior to forming the conductive layer 130.

Referring to FIG. 2B, the conductive layer 130 for the upper electrode and the tantalum oxide layer 120 can be dry etched to expose portions of the conductive layer 110 for the lower electrode. Accordingly, sidewalls of the conductive layer 130 for the upper electrode and the tantalum oxide layer 120 can be exposed. Referring to FIG. 2C, a thermal process can be performed on the resultant structure to relieve an interface stress between the conductive layer 130 for the upper electrode and the tantalum oxide layer 120, and to improve the dielectric constant of the tantalum oxide layer 120.

The thermal process can be performed by various methods as discussed below. In a first example of thermal processing, a first thermal process can be performed on the resultant structure at a temperature in the range of about 450° C. to 600° C. and in an inert gas atmosphere for about 30 minutes. Thereafter, a second thermal process can be performed on the resultant structure at a temperature in the range of about 350° C. to 450° C. in a gas atmosphere including oxygen for about 30 minutes.

In a second example of thermal processing, a thermal process can be performed on the resultant structure at a temperature in the range of about 450° C. to 600° C. and in an inert gas atmosphere for about 30 minutes. In a third example of thermal processing, a first thermal process can be performed on the resultant structure at a temperature in the range of about 350° C. to 450° C. and in a gas atmosphere including oxygen for about 30 minutes. Thereafter, a second thermal process can be performed on the resultant structure at a temperature in the range of about 450° C. to 600° C. and in an inert gas atmosphere for about 30 minutes.

In the first through third examples of thermal processing, the inert gas may include, for example, argon Ar and/or nitrogen $N_2$, and the gas including oxygen may include oxygen gas $O_2$ and/or oxygen nitride gas $NO_2$. In the first and third examples of thermal processing, the first and second thermal processes can be performed in situ. Accordingly, a wafer does not need to be transferred between chambers so that defects on the wafer can be reduced.

It may be efficient to perform the thermal process in a gas atmosphere including oxygen. Oxygen, however, may permeate into the conductive layer 130 for the upper electrode and the tantalum oxide layer 120 when the thermal process is performed at a temperature of over 600° C. and in the gas atmosphere including oxygen. Thus, the thermal process may be performed at a temperature of under 500° C. in an oxygen gas atmosphere and the thermal process may be performed at a temperature of over 500° C. in an inert gas atmosphere.

Because the thermal processes are collectively performed after the conductive layer for the upper electrode and the tantalum oxide layer have been etched, interface stress between the conductive layer 130 for the upper electrode and the tantalum oxide layer 120 may be efficiently relieved. In addition, because the heat can be transferred to the tantalum oxide layer 120 via exposed sidewalls of the tantalum oxide layer 120, the tantalum oxide layer 120 may be cured. Furthermore, the thermal processes can be performed collectively to simplify the process.

Figure 1B:
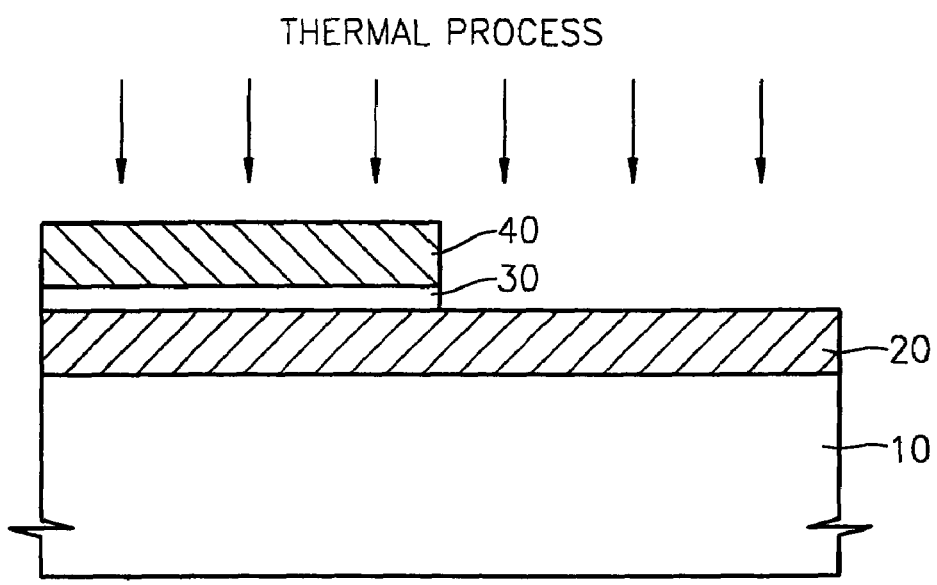
Figure 3:
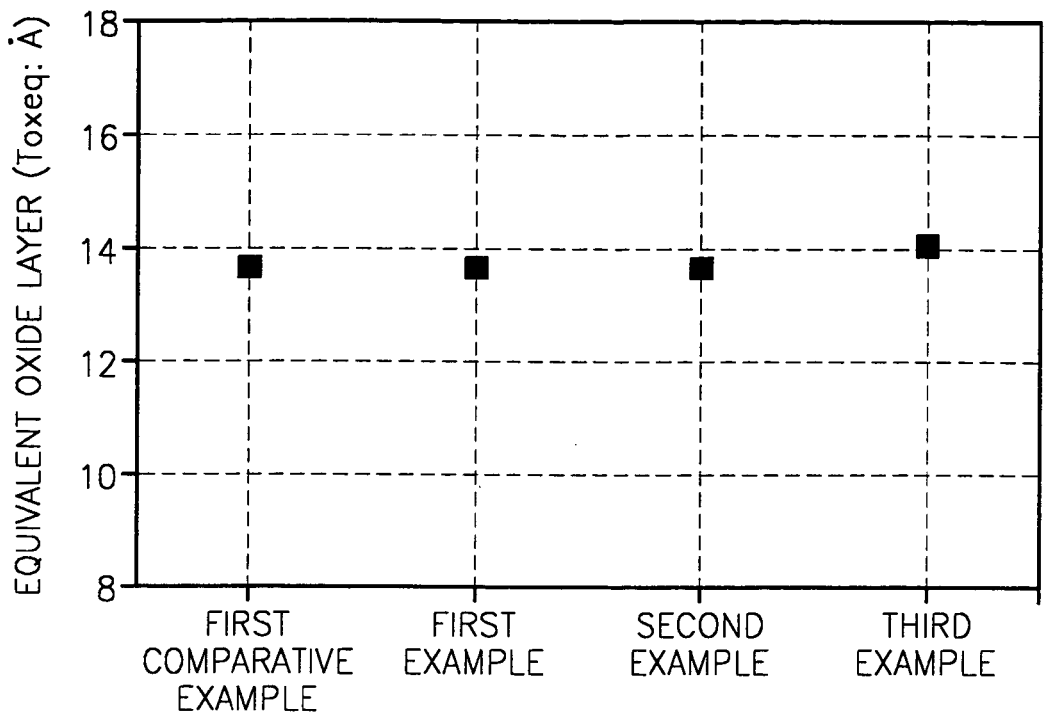
FIG. 3 is a graph illustrating equivalent oxide thicknesses of tantalum oxide layers according to embodiments of the present invention.

Here, the dielectric constant and the leakage current of the tantalum oxide layer may be unaffected even if the thermal processes are performed collectively after the etching process, as discussed below with reference to FIGS. 3 and 4. FIG. 3 is a graph illustrating an equivalent oxide thickness of the tantalum oxide layer according to first embodiments of the present invention discussed above with respect to FIGS. 2A–C. The first comparative example in the graph of FIG. 3 refers to a capacitor manufactured as discussed above with respect to FIGS. 1A and 1B.

According to the graph, equivalent oxide thicknesses according to the first through third examples of thermal processing and an equivalent oxide thickness of the comparative example are similar. In other words, comparative thermal processes and collective thermal processes according to first embodiments of the present invention discussed above with respect to FIGS. 2A–C can provide tantalum oxide layers having similar dielectric constants.

Figure 4:
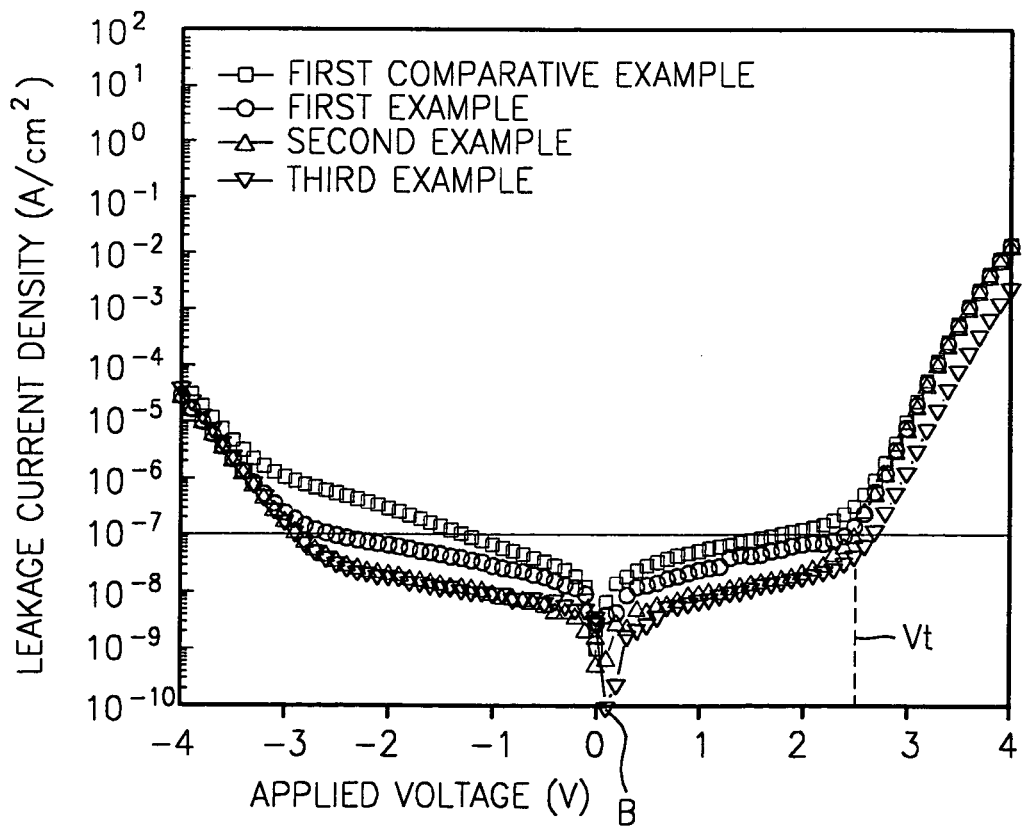
FIG. 4 is a graph illustrating leakage currents of capacitors according to embodiments of the present invention.

FIG. 4 is a graph illustrating leakage currents of capacitors according to first through third examples of thermal processing according to embodiments of the present invention. According to the graph of FIG. 4, capacitor leakage currents according to the first through third examples of thermal processing according to embodiments of the present invention may be lower than comparative capacitor leakage currents. In addition, the base-levels B of the leakage currents according to the first through third examples of thermal processes according to embodiments of the present invention may be lower than the base-level B of comparative leakage currents. Furthermore, the take voltages Vt at which the leakage currents increase more dramatically may be more stable in capacitors according to first through third examples of thermal processes according to embodiments of the present invention.

Based on the graphs of FIGS. 3 and 4, methods of performing thermal processes according to first through third examples of thermal processing according to embodiments of the present invention may provide dielectric constants and/or equivalent oxide thicknesses, similar to those of comparative methods. In addition, methods including the first through third examples of thermal processing may significantly improve leakage currents. Methods of forming capacitors, according to embodiments of the present invention including first through third examples of thermal processing, can provide tantalum oxide layers having reduced thicknesses without significantly increasing leakage currents. Because dielectric layers formed according to first embodiments of the present invention discussed above with respect to FIGS. 2A–C can have dielectric constants similar to those of comparative dielectric layers while reducing leakage currents, thicknesses of dielectric layers can be reduced without significantly increasing leakage currents.

Figure 5:
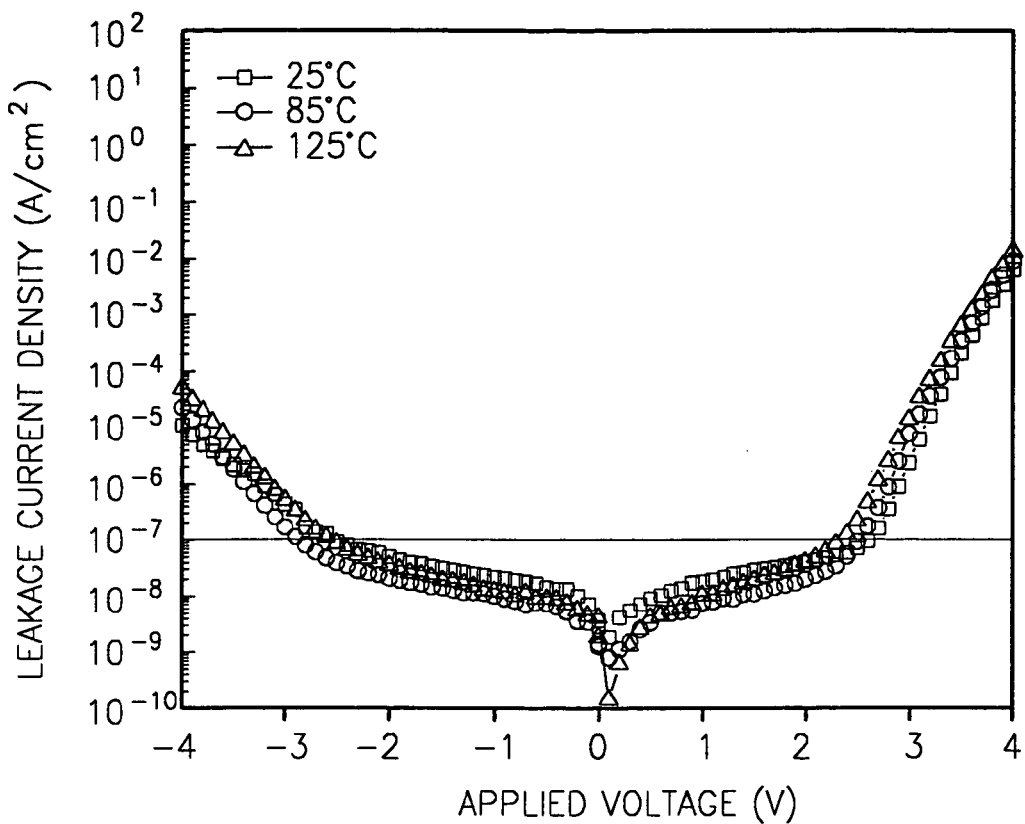
FIG. 5 is a graph illustrating leakage currents of capacitors with respect to changes in temperature according to embodiments of the present invention.

FIG. 5 is a graph illustrating leakage currents of capacitors with respect to changes in temperature, according to the first embodiments of the present invention discussed above with respect to FIGS. 2A–C. In particular, capacitors of FIG. 5 are manufactured by methods including the second example of thermal processing according to embodiments of the present invention. According to the graph of FIG. 5, the leakage currents of the capacitor may not change significantly according to changes in temperature, such as 25° C., 85° C., and 125° C. Accordingly, the leakage current of the dielectric layer may not be significantly dependent on the temperature. In addition, it may be assumed that the dielectric layer, i.e., the tantalum oxide layer, may be stably formed.

According to first embodiments of the present invention discussed above with respect to FIGS. 2A–C, by collectively performing the thermal processing after etching the upper electrode layer and the dielectric layer, the process can be simplified and improved dielectric layers can be obtained.

In addition, capacitor dielectric layers according to embodiments of the present invention discussed above with respect to FIGS. 2A–C can have a dielectric constant similar to that of a comparative capacitor dielectric layer while providing improved leakage current characteristics. Accordingly, a stable capacitor can be formed and the capacitance can be improved by reducing the thickness of the dielectric layer, i.e., the tantalum oxide layer.

Processes according to second embodiments of the present invention can be the same as those of first embodiments of the present invention with the exception of temperatures used in the thermal processing of FIG. 2C. Methods according to second embodiments of the present invention will now be described with FIGS. 2A through 2C.

Referring to FIG. 2C, a conductive layer 130 for an upper electrode and a tantalum oxide layer 120 can be dry etched. Thereafter, a thermal process can be performed to relieve interface stresses between the conductive layer 130 for the upper electrode and the tantalum oxide layer 120, and to crystallize the tantalum oxide layer 120.

Here, the thermal process can be performed by various methods as discussed below. In a fourth example of thermal processing, a first thermal process can be performed on the resultant structure at a temperature in the range of about 650 to 700° C. and in an inert gas atmosphere for about 30 minutes. Thereafter, a second thermal process can be performed on the resultant structure at a temperature in the range of about 350° C. to 450° C. in a gas atmosphere including oxygen for about 30 minutes. In a fifth example of thermal processing, a thermal process can be performed on the resultant structure at a temperature in the range of about 650° C. to 700° C. and in an inert gas atmosphere and/or a gas atmosphere including nitrogen for about 30 minutes.

In a sixth example of thermal processing, a first thermal process can be performed on the resultant structure at a temperature in the range of about 350° C. to 450° C. and in a gas atmosphere including oxygen for about 30 minutes. Thereafter, a second thermal process can be performed on the resultant structure at a temperature in the range of about 450° C. to 600° C. and in an inert gas atmosphere and/or a gas atmosphere including nitrogen for about 30 minutes. In the fourth and sixth examples of thermal processing, the first and second thermal processes can be performed in situ. Accordingly, a wafer is not required to be transferred between chambers so that defects on the wafer can be reduced.

In the fourth through sixth examples of thermal processing, the inert gas may include Ar and/or $N_2$, and the gas including oxygen may include $O_2$ and/or $NO_2$. The thermal processes can be performed after the etching processes have been performed to efficiently relieve interface stresses between the conductive layer 130 for the upper electrode and the tantalum oxide layer 120. In addition, because heat can be transferred to the tantalum oxide layer 120 via exposed sidewalls of the tantalum oxide layer 120, the tantalum oxide layer 120 can be cured and crystallized.

When the tantalum oxide layer 120 is crystallized at a temperature of higher than 650° C., the dielectric constant may be lowered and the leakage current may increase. A tantalum oxide layer in an amorphous state may thus be used as the dielectric layer. However, when the thermal processes are collectively performed at a temperature greater than about 650° C. after dry etching has been performed, the dielectric constant of the tantalum oxide layer may be similar to that of a crystalline tantalum oxide layer while significantly reducing leakage currents. It will now be described with reference to FIGS. 6 and 7.

Figure 6:
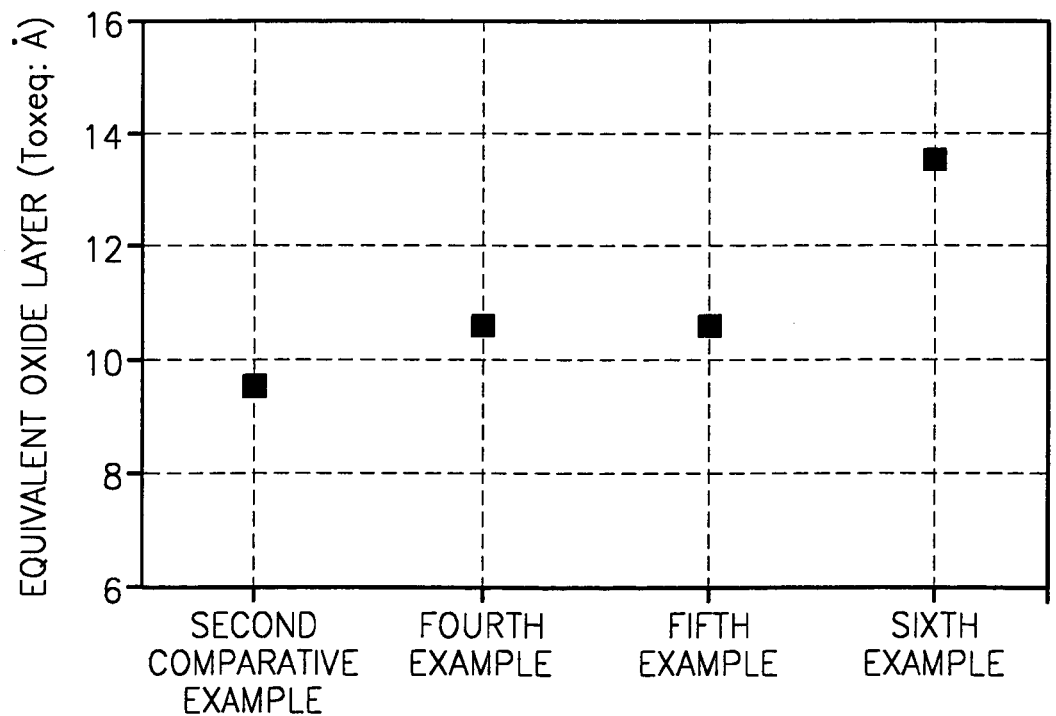
FIG. 6 is a graph illustrating equivalent oxide thicknesses of tantalum oxide layers according to embodiments of the present invention.

FIG. 6 is a graph illustrating equivalent oxide thicknesses of tantalum oxide layers according to second embodiments of the present invention. A second comparative example in the graph of FIG. 6 refers to an equivalent oxide thickness of a tantalum oxide layer in a capacitor manufactured by depositing a tantalum oxide layer, performing a thermal process on the tantalum oxide layer at a temperature greater than 650° C., depositing an upper electrode, dry etching the upper electrode and the tantalum oxide layer, and performing a thermal process to relieve interface stresses between the upper electrode and the tantalum oxide layer. According to the graph of FIG. 6, the equivalent oxide thicknesses according to the fourth through sixth examples of thermal processing, i.e., 10.5 Å, 10.5 Å, and 13.8 Å, are greater than the second comparative equivalent oxide thicknesses, i.e., about 9 Å, with the differences being about 1 Å to 3 Å. In addition, the equivalent oxide thicknesses according to the fourth through sixth examples of thermal processing are less than the thickness of the first comparative equivalent oxide layer, i.e., about 14 Å. Therefore, tantalum oxide layers according to methods including the fourth through sixth examples of thermal processing may have dielectric constants similar to that of crystalline tantalum oxide layers and dielectric constants better than that of amorphous tantalum oxide layers.

Figure 7:
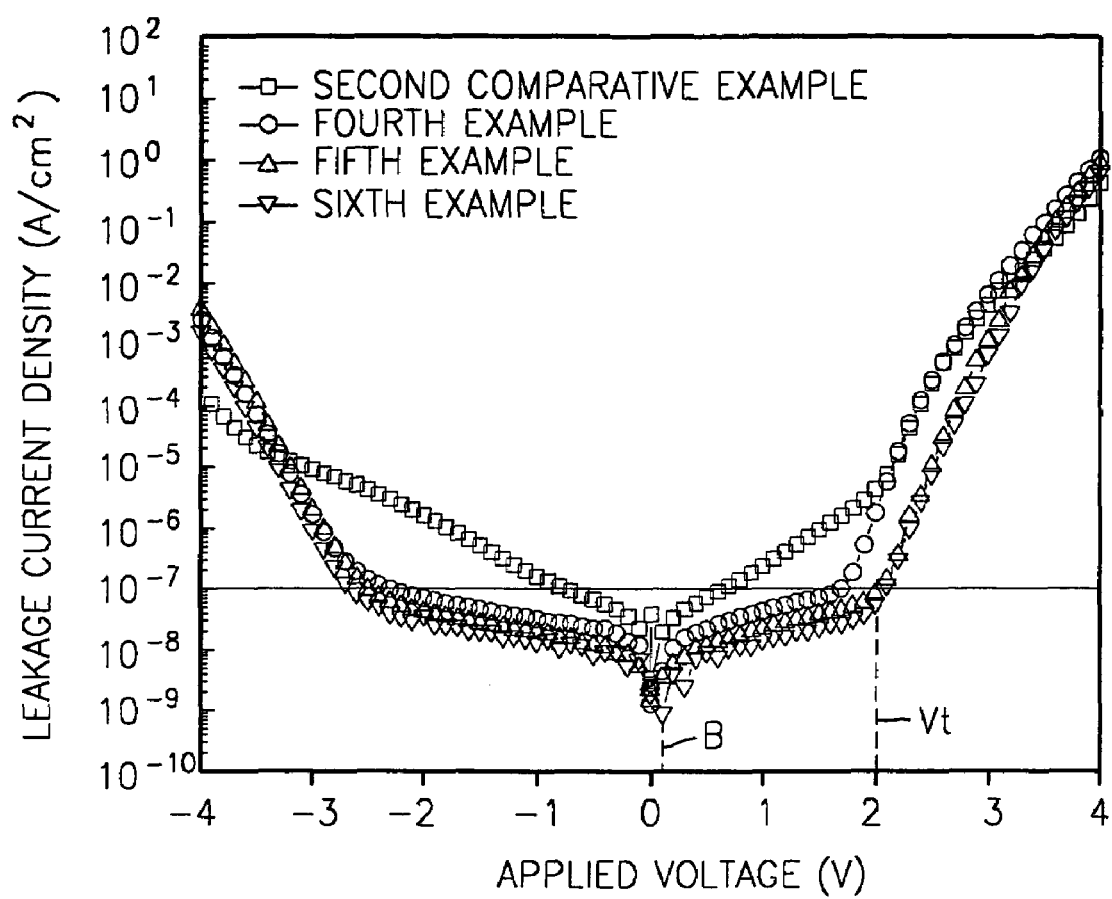
FIG. 7 is a graph illustrating leakage currents of capacitors according to embodiments of the present invention.

On the other hand, FIG. 7 is a graph illustrating leakage currents of capacitors according to the fourth through sixth examples of thermal processing. According to the graph of FIG. 7, leakage currents of the capacitors according to the fourth through sixth examples of thermal processing may be lower than leakage currents of the second comparative capacitor. In addition, base-levels B of the leakage currents according to the fourth through sixth examples of thermal processing may be lower than the base-level B of second comparative leakage currents. Furthermore, take voltages Vt at which the leakage currents are increase significantly may be improved in the fourth through sixth examples of thermal processing. As a result, even when the tantalum oxide layer 120 is crystallized as shown in second embodiments of the present invention, leakage currents can be stable and dielectric constants can be improved.

Figure 8A:
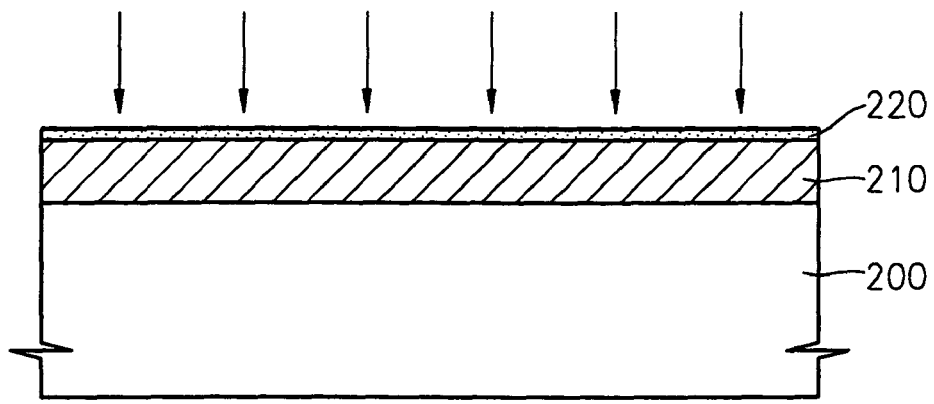
FIGS. 8A through 8C are cross-sectional views illustrating methods for manufacturing semiconductor memory devices according to embodiments of the present invention.
Figure 8B:
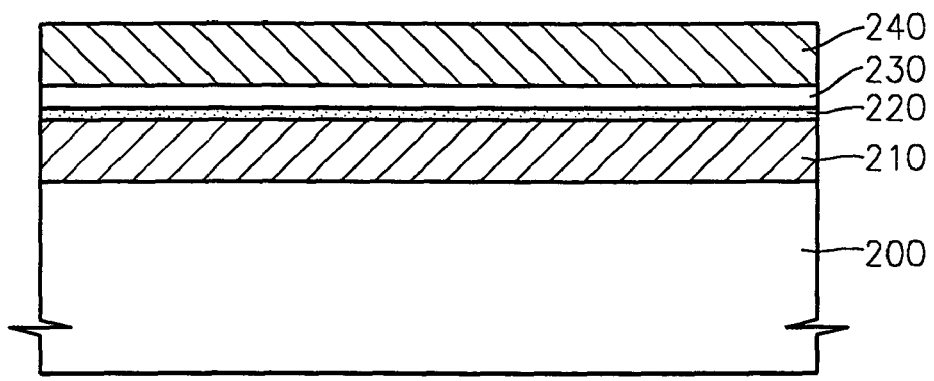
Figure 8C:
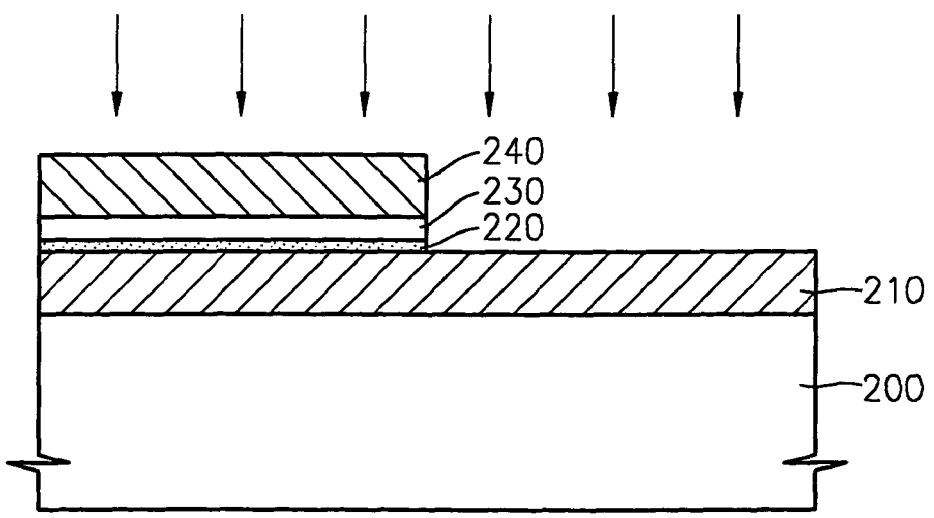

FIGS. 8A through 8C are cross-sectional views illustrating methods for manufacturing semiconductor memory devices according to third embodiments of the present invention. Referring to FIG. 8A, a conductive layer 210 for a lower electrode is deposited on a semiconductor substrate 200. The conductive layer 210 for the lower electrode may be formed of, for example, a metal such as Pt, Ru, Ir, Rh, and/or Os having a relatively high work function. A tantalum oxide layer seed layer 220 can be deposited on the conductive layer 210 for the lower electrode to a thickness, for example, in the range of about 30 to 60 Å. Thereafter, the seed layer 220 can be crystallized at a temperature in the range of about 650° C. to 750° C. Because the seed layer 220 can be a relatively thin layer, the thermal process on the seed layer 220 can be performed for a relatively short time.

Referring to FIG. 8B, a tantalum oxide layer 230 can be deposited on the seed layer 220. Here, the tantalum oxide layer 230 can be formed using chemical vapor deposition (CVD) at a temperature in the range of about 380° C. to 500° C. Because the tantalum oxide layer 230 can be deposited on the crystalline seed layer 220, a portion of the tantalum oxide layer 230 can be crystallized. Thereafter, a conductive layer 240 for an upper electrode can be deposited on the tantalum oxide layer 230. The conductive layer 240 for the upper electrode can be formed of the same material as the conductive layer 210 for the lower electrode. Curing used to improve dielectric characteristics of the tantalum oxide layer 230 can be omitted between depositing the tantalum oxide layer 230 and depositing the conductive layer 240 for the upper electrode.

Referring to FIG. 8C, the conductive layer 240 for the upper electrode, the tantalum oxide layer 230, and the seed layer 220 can be dry etched to expose portions of the conductive layer 210 for the lower electrode. Accordingly, the sidewalls of the conductive layer 240 for the upper electrode, the tantalum oxide layer 230, and the seed layer 220 can be exposed. Next, a thermal process can be performed on the resultant structure to relieve interface stresses between the conductive layer 240 for an upper electrode and the tantalum oxide layer 230 and to improve dielectric characteristics of the tantalum oxide layer 230. In the present embodiments, a first thermal process can be performed on the resultant structure at a temperature in the range of about 450° C. to 600° C. and in an inert gas atmosphere for about 30 minutes. Thereafter, a second thermal process can be performed on the resultant structure at a temperature in the range of about 350° C. to 450° C. in a gas atmosphere including oxygen for about 30 minutes. In this case, the inert gas may include Ar and/or $N_2$, and the gas including oxygen may include $O_2$ and/or $NO_2$. In third embodiments, the first and second thermal processes can be performed in situ. Accordingly, when the tantalum oxide layer 230 is formed using the seed layer 220 and the thermal processes are collectively performed after the dry etching process, stable dielectric constants and reduced leakage currents can be obtained.

Figure 9:
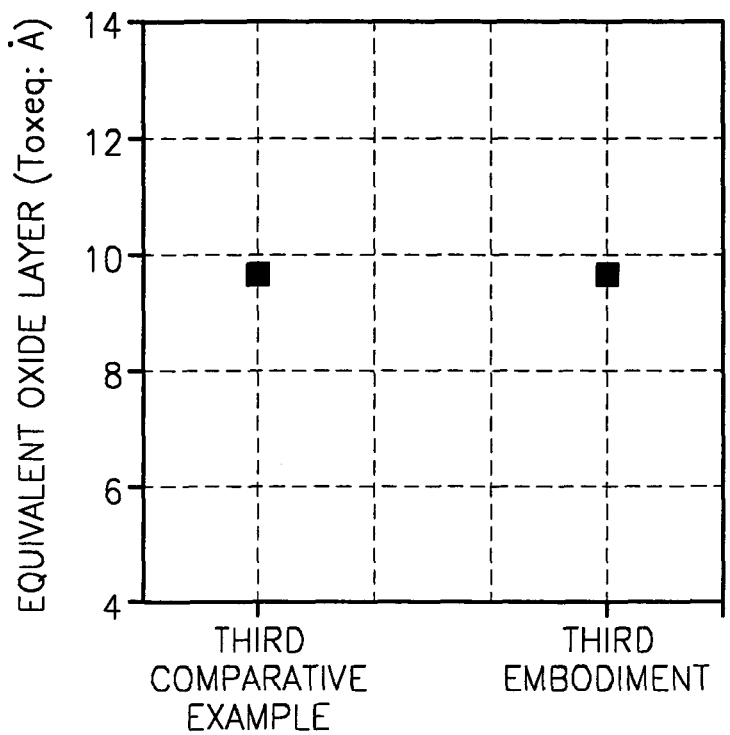
FIG. 9 is a graph illustrating equivalent oxide thicknesses of tantalum oxide layers according to embodiments of the present invention.

FIG. 9 is a graph illustrating equivalent oxide thicknesses of the tantalum oxide layer according to third embodiments of the present invention. A third comparative example in the graph of FIG. 9 refers to the thickness of a tantalum oxide layer in a capacitor, manufactured by forming a seed layer, crystallizing the seed layer, depositing a tantalum oxide layer, curing the tantalum oxide layer, depositing an upper electrode, dry etching the upper electrode and the tantalum oxide layer, and performing a thermal process to relieve interface stresses between the upper electrode and the tantalum oxide layer. The equivalent oxide thickness according to third embodiments of the present invention is similar to that of the third comparative equivalent oxide thickness so that the dielectric constants are similar.

Figure 10:
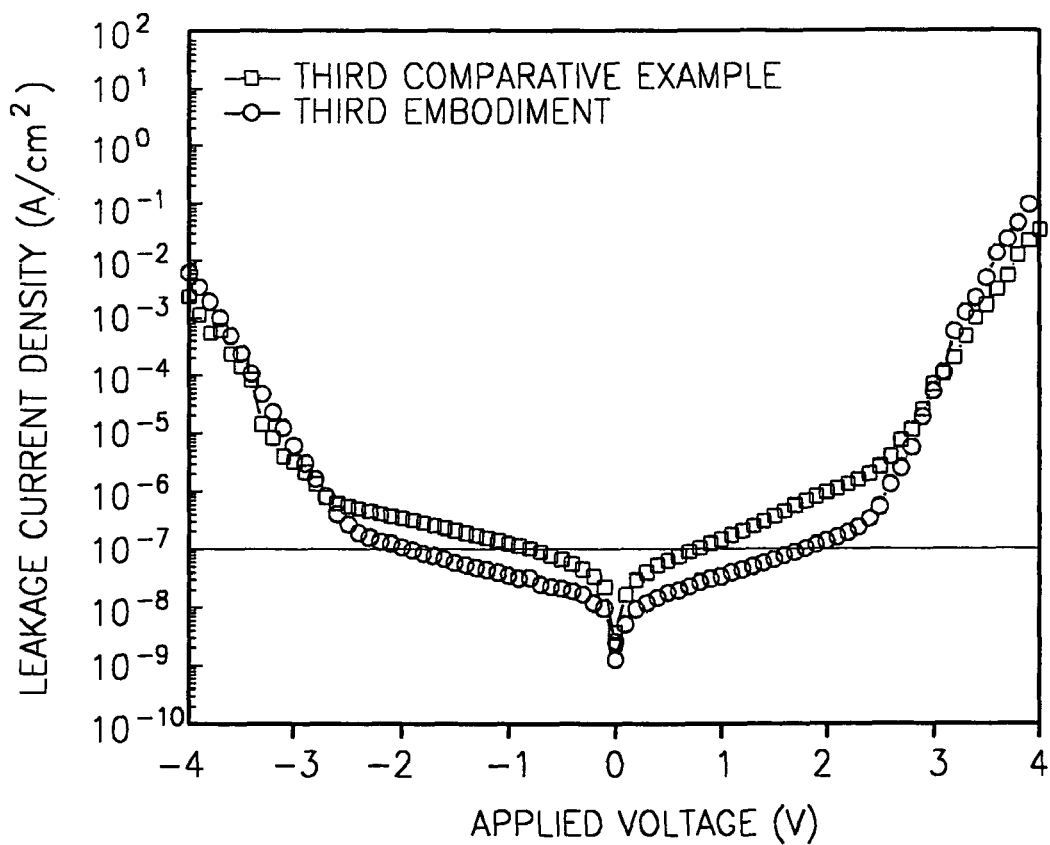
FIG. 10 is a graph illustrating leakage currents of capacitors according to embodiments of the present invention.

FIG. 10 is a graph illustrating leakage currents of a capacitor according to third embodiments of the present invention. Referring to the graph of FIG. 10, leakage currents of the capacitor according to third embodiments of the present invention may be less than that of the third comparative capacitor.

Accordingly, methods according to third embodiments of the present invention may omit curing of the tantalum oxide layer to reduce transferring of a wafer between chambers and to reduce an amount of time for processes. In addition, methods according to third embodiments of the present invention may reduce leakage currents to provide a stable capacitor and to realize a high capacitance.

As described above, a thermal process for curing the dielectric layer may be omitted after the dielectric layer is deposited. Thermal processes for relieving interface stresses between the upper electrode and the dielectric layer and the curing process of the dielectric layer may be collectively performed after the upper electrode and the dielectric layer are dry etched. Thus, the number of thermal processes can be reduced so that wafer transfers and process times can be reduced.

In addition, the tantalum oxide layers formed by methods according to embodiments of the present invention may have dielectric constants similar to those of comparative tantalum oxide layers and may have improved leakage current characteristics. Accordingly, a stable capacitor can be formed and the thickness of the dielectric layer, i.e. the tantalum oxide layer, can be reduced to provide a relatively high capacitance.

Embodiments of the present invention may provide simplified methods for manufacturing semiconductor memory devices. According to embodiments of the present invention, methods may be provided for fabricating a semiconductor memory device. After depositing a conductive layer for a lower electrode on a semiconductor substrate, a dielectric layer can be deposited on the conductive layer for the lower electrode, and a conductive layer for an upper electrode can be deposited on the dielectric layer. Thereafter, portions of the conductive layer for the upper electrode and the dielectric layer can be etched, and a thermal process can be performed on the conductive layer for the upper electrode and the dielectric layer.

According to additional embodiments of the present invention, methods can be provided for fabricating semiconductor memory devices. After depositing a conductive layer for a lower electrode on a semiconductor substrate, a tantalum oxide layer can be deposited on the conductive layer for the lower electrode, and a conductive layer for an upper electrode can be deposited on the tantalum oxide layer. Thereafter, portions of the conductive layer for the upper electrode and the tantalum oxide layer can be dry etched. A thermal process can be performed to reduce an interface stress between the conductive layer for the upper electrode and the tantalum oxide layer and to cure the tantalum oxide layer. Here, the tantalum oxide layer may maintain a substantially amorphous state after the thermal process.

The thermal process may include performing a first thermal process on the resultant structure at a temperature in the range of about 450° C. to 600° C. in an inert gas atmosphere, and performing a second thermal process on the semiconductor resultant structure at a temperature in the range of about 350° C. to 450° C. in a gas atmosphere including oxygen. The thermal process may be performed on the resultant structure at a temperature in the range of about 450° C. to 600° C. in an inert gas atmosphere. The thermal process may alternately include performing a first thermal process on the resultant structure at a temperature in the range of about 350° C. to 450° C. in a gas atmosphere including oxygen, and performing a second thermal process on the resultant structure at a temperature in the range of about 450° C. to 600° C. in an inert gas atmosphere.

According to still additional embodiments of the present invention, methods may be provided for fabricating semiconductor memory devices. After depositing a conductive layer for a lower electrode on a semiconductor substrate, a tantalum oxide layer can be deposited on the conductive layer for the lower electrode, and a conductive layer for an upper electrode can be deposited on the tantalum oxide layer. Thereafter, portions of the conductive layer for the upper electrode and the tantalum oxide layer can be dry etched. A thermal process can be performed to reduce an interface stress between the conductive layer for the upper electrode and the tantalum oxide layer, and to crystallize at least a portion of the tantalum oxide layer.

Here, the thermal process may include performing a first thermal process on the resultant structure at a temperature in the range of about 650° C. to 700° C. in an inert gas atmosphere, and performing a second thermal process on the semiconductor resultant structure at a temperature in the range of about 350° C. to 450° C. in a gas atmosphere including oxygen. The thermal process may be performed on the resultant structure at a temperature in the range of about 650° C. to 700° C. in an inert gas atmosphere. The thermal process may alternately include performing a first thermal process on the resultant structure at a temperature in the range of about 350° C. to 450° C. in a gas atmosphere including oxygen, and performing a second thermal process on the resultant structure at a temperature in the range of about 650° C. to 700° C. in an inert gas atmosphere.

According to yet additional embodiments of the present invention, methods may be provided for fabricating semiconductor memory devices. After depositing a conductive layer for a lower electrode on a semiconductor substrate, a seed layer of a tantalum oxide layer can be deposited on the conductive layer for the lower electrode, and the tantalum oxide layer seed layer can be crystallized. Thereafter, a tantalum oxide layer can be deposited on the crystallized tantalum oxide seed layer, and a conductive layer for an upper electrode can be deposited on the tantalum oxide layer. Portions of the conductive layer for the upper electrode and the tantalum oxide layer can be dry etched. Next, a thermal process can be performed to reduce an interface stress between the conductive layer for the upper electrode and the tantalum oxide layer, and to cure the tantalum oxide layer.

Here, the thermal process may include performing a first thermal process on the resultant structure at a temperature in the range of about 450° C. to 600° C. in an inert gas atmosphere, and performing a second thermal process on the resultant structure at a temperature in the range of about 350° C. to 450° C. in a gas atmosphere including oxygen. The first and second thermal processes can be performed in situ. The inert gas may include argon Ar or nitrogen $N_2$, and the gas including oxygen may include oxygen gas $O_2$ or oxygen nitride gas $NO_2$.

The tantalum oxide seed layer may be formed to a thickness in the range of about 30 Å to 60 Å, and the tantalum oxide seed layer may be crystallized by performing a thermal process at a temperature in the range of about 650° C. to 750° C. The conductive layer for a lower electrode can be formed of at least one material selected from the group of platinum (Pt), ruthenium (Ru), iridium (Ir), rhodium (Rh), and/or osmium (Os), and the conductive layer for an upper electrode can be formed of the same material as the conductive layer for the lower electrode. In addition, the tantalum oxide layer may be deposited at a temperature in the range of about 380° C. to 500° C. using chemical vapor deposition (CVD).

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A method for fabricating a semiconductor device, the method comprising:
   forming a first conductive layer for a first electrode on a semiconductor substrate;
   depositing an amorphous dielectric layer on the first conductive layer;
   forming a second conductive layer for a second electrode on the amorphous dielectric layer, without performing a thermal process to cure the dielectric layer between depositing the dieletric layer and forming the second conductive layer;
   etching portions of the second conductive layer and portions of the dielectric layer to expose sidewalls of the dielectric layer; and
   collectively performing a thermal process on the second conductive layer and the dielectric layer thereby curing the dielectric layer.

2. The method of claim 1, wherein the thermal process comprises:
   heating the second conductive layer and the dielectric layer to a first temperature in the range of about 450° C. to 600° C. in an inert gas atmosphere; and
   then, heating the second conductive layer and the dielectric layer to a second temperature in the range of about 350° C. to 450° C. in a gas atmosphere including oxygen.

3. The method of claim 1, wherein forming the dielectric layer is preceded by:
   depositing a seed layer on the first conductive layer; and
   crystallizing the seed layer.

4. The method of claim 1, wherein the performing the thermal process comprises heating the dielectric layer and the second conductive layer at a temperature in the range of about 450° C. to 600° C. in an inert gas atmosphere.

5. The method of claim 1, wherein performing the thermal process comprises:
   heating the dielectric layer and the second conductive layer at a first temperature in the range of about 350° C. to 450° C. in a gas atmosphere including oxygen; and
   then, heating the dielectric layer and the second conductive layer at a second temperature in the range of about 450° C. to 600° C. in an inert gas atmosphere.

6. The method of claim 1, wherein performing the thermal process comprises:
   heating the dielectric layer and the second conductive layer at a first temperature in the range of about 650° C. to 700° C. in an inert gas atmosphere; and
   then, heating the dielectric layer and the second conductive layer at a second temperature in the range of about 350° C. to 450° C. in a gas atmosphere including oxygen.

7. The method of claim 1, wherein performing the thermal process comprises heating the dielectric layer and the second conductive layer at a temperature in the range of about 650° C. to 700° C. in an inert gas atmosphere.

8. The method of claim 1, wherein performing the thermal process comprises:
   heating the dielectric layer and the second conductive layer at a first temperature in the range of about 350° C. to 450° C. in a gas atmosphere including oxygen; and
   then, heating the dielectric layer and the second conductive layer at a second temperature in the range of about 650° C. to 700° C. in an inert gas atmosphere.

9. The method of claim 1, wherein the first conductive layer comprises at least one material selected from the group consisting of platinum (Pt), ruthenium (Ru), iridium (Ir), rhodium (Rh), and/or osmium (Os).

10. The method of claim 9, wherein the second conductive layer comprises a same material as the first conductive layer.

11. The method of claim 1, wherein forming the dielectric layer comprises forming a tantalum oxide layer.

12. The method of claim 1, wherein forming the dielectric layer comprises depositing tantalum oxide at a temperature in the range of about 380° C. to 500° C. using chemical vapor deposition (CVD).

13. The method of claim 1, wherein etching portions of the second conductive layer and the dielectric layer comprises dry etching the second conductive layer and the dielectric layer.

14. The method of claim 1 wherein performing the thermal process comprises performing the thermal process on the second conductive layer and the dielectric layer after removing portions of the second conductive layer and the dielectric layer.

15. The method of claim 1 wherein performing the thermal process comprises performing a thermal process after removing portions of the second conductive layer and after removing portions of the dielectric layer.

16. A method for fabricating a semiconductor device, the method comprising:

forming a first conductive layer for a first electrode on a semiconductor substrate;

depositing an amorphous tantalum oxide layer on the first conductive layer;

forming a second conductive layer for a second electrode on the amorphous tantalum oxide layer without performing a thermal process to cure the tantalum oxide layer between depositing the tantalum oxide layer and forming the second conductive layer;

etching portions of the second conductive layer and portions of the tantalum oxide layer to expose sidewalls of the tantalum oxide layer; and collectively performing a thermal process to reduce an interface stress between the second conductive layer and the deposited tantalum oxide layer and to cure the deposited tantalum oxide layer.

17. The method of claim 16, wherein performing the thermal process comprises:

heating the tantalum oxide layer and the second conductive layer at a first temperature in the range of about 450° C. to 600° C. in an inert gas atmosphere; and then, heating the tantalum oxide layer and the second conductive layer at a second temperature in the range of about 350° C. to 450° C. in a gas atmosphere including oxygen.

18. The method of claim 17, wherein heating at the first temperature and heating at the second temperature are performed in situ.

19. The method of claim 16, wherein performing the thermal process comprises heating the tantalum oxide layer and the second conductive layer at a temperature in the range of about 450° C. to 600° C. in an inert gas atmosphere.

20. The method of claim 16, wherein the thermal process comprises:

heating the tantalum oxide layer and the second conductive layer at a first temperature in the range of about 350° C. to 450° C. in a gas atmosphere including oxygen; and then, heating the tantalum oxide layer and the second conductive layer at a second temperature in the range of about 450° C. to 600° C. in an inert gas atmosphere.

21. The method of claim 16, wherein heating at the first temperature and heating at the second temperature are performed in situ.

22. The method of claim 16, wherein the first conductive layer comprises at least one material selected from the group consisting of Pt, Ru, Ir, Rh, and/or Os.

23. The method of claim 22, wherein the second conductive layer comprises a same material as the first conductive layer.

24. The method of claim 16, wherein forming the tantalum oxide layer comprises depositing tantalum oxide at a temperature in the range of about 380° C. to 500° C. using chemical vapor deposition.

25. The method of claim 16 wherein performing the thermal process comprises performing a thermal process after removing portions of the second conductive layer and after removing portions of the tantalum oxide layer.

26. A method for fabricating a semiconductor device, the method comprising:

forming a first conductive layer for a first electrode on a semiconductor substrate;

forming a dielectric layer on the first conductive layer;

forming a second conductive layer for a second electrode on the dielectric layer;

after forming the dielectric layer and after forming the second conductive layer, removing portions of the second conductive layer and portions of the dielectric layer thereby exposing portions of the first conductive layer previously covered by the dielectric layer; and after removing portions of the second conductive layer and after removing portions of the dielectric layer, performing a thermal process on the second conductive layer and the dielectric layer at a temperature of at least about 400° C. while the second conductive layer remains exposed wherein the performing the thermal process comprises heating the dielectric layer and the second conductive layer at a temperature in the range of about 450° C. to 600° C. in an inert gas atmosphere.

27. A method for fabricating a semiconductor device, the method comprising:

forming a first conductive layer for a first electrode on a semiconductor substrate;

forming a tantalum oxide layer on the first conductive layer;

forming a second conductive layer for a second electrode on the tantalum oxide layer;

after forming the tantalum oxide layer and after forming the second conductive layer, removing portions of the second conductive layer and portions of the tantalum oxide layer thereby exposing portions of the first conductive layer previously covered by the tantalum oxide layer; and after removing portions of the second conductive layer and after removing portions of the tantalum oxide layer, performing a thermal process to reduce an interface stress between the second conductive layer and the tantalum oxide layer and to cure the tantalum oxide layer, while maintaining the tantalum oxide layer in a substantially amorphous state during and after the thermal process wherein performing the thermal process comprises heating the tantalum oxide layer and the second conductive layer at a temperature in the range of about 450° C. to 600° C. in an inert gas atmosphere while the second conductive layer remains exposed.

* * * * *